United States Patent
Jung et al.

(10) Patent No.: US 8,053,681 B2
(45) Date of Patent: Nov. 8, 2011

(54) INTEGRATED CIRCUIT PACKAGE AND MANUFACTURING METHOD THEREOF

(75) Inventors: Ji-Hyun Jung, Gwangju-si (KR); Shi-Yun Cho, Anyang-si (KR); Young-Min Lee, Yongin-si (KR); Youn-Ho Choi, Seoul (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 620 days.

(21) Appl. No.: 12/201,153

(22) Filed: Aug. 29, 2008

(65) Prior Publication Data

US 2009/0057001 A1    Mar. 5, 2009

(30) Foreign Application Priority Data

Aug. 31, 2007   (KR) .................. 10-2007-0088202

(51) Int. Cl.
*H05K 1/16* (2006.01)

(52) U.S. Cl. ........ 174/264; 174/258; 174/260; 174/262; 361/760; 361/762; 361/763; 361/764; 257/99; 257/777; 257/E21.505; 257/E33.075; 29/829; 29/830; 29/832; 29/846; 29/852; 438/118; 438/122; 438/654

(58) Field of Classification Search .......... 174/250–264, 174/525; 361/760–767, 783, 784, 790–794, 361/776, 735, 777; 257/E21.499, E21.505, 257/E21.508, E21.509, E21.514, E21.511, 257/E21.599, E21.506, E23.019, E23.008, 257/E23.131, E33.075, 698, 678, 713, 706, 257/762, 88, 98, 99, 778, 77, 737, 734, 772, 257/707, 784, 672; 438/26, 106–113, 118, 438/122, 99, 124, 125, 396, 393, 617, 311, 438/584, 589, 647, 648, 684, 685, 654, 657; 29/829–835, 840–846, 850–854

See application file for complete search history.

(56) References Cited

U.S. PATENT DOCUMENTS

| | | | | |
|---|---|---|---|---|
| 6,909,054 B2 * | 6/2005 | Sakamoto et al. | ............ | 174/260 |
| 6,969,916 B2 * | 11/2005 | Shizuno | ........................ | 257/784 |
| 7,282,394 B2 * | 10/2007 | Cho et al. | ...................... | 438/118 |
| 7,285,728 B2 * | 10/2007 | Sunohara et al. | ............. | 174/260 |
| 7,414,309 B2 * | 8/2008 | Oi et al. | ........................ | 257/700 |
| 7,435,910 B2 * | 10/2008 | Sakamoto et al. | ............ | 174/260 |
| 7,842,887 B2 * | 11/2010 | Sakamoto et al. | ............ | 174/260 |
| 7,885,342 B2 * | 2/2011 | Brainos et al. | ................ | 375/259 |
| 7,894,203 B2 * | 2/2011 | Kariya et al. | ................. | 361/768 |
| 2009/0316373 A1 * | 12/2009 | Kim et al. | ..................... | 361/764 |

* cited by examiner

*Primary Examiner* — Michail V Datskovskiy
(74) *Attorney, Agent, or Firm* — Cha & Reiter, LLC

(57) ABSTRACT

An IC package includes: a multi-layered PCB having a plurality of insulating layers and a plurality of conductive pattern layers stacked in sequence and a plurality of via-holes formed through the plurality of the insulating layers for an electrical connection between the layers; and an IC chip disposed in a core insulating layer of the plurality of the insulating layers to be embedded in the multi-layered PCB and including a plurality of input/output pads on their surface. The input/output pads disposed at an outermost area of the IC chip are coupled to outer terminals by connection members without passing through said via-hole, the remaining input/output pads except for the input/output pads disposed at the outermost area of the IC chip are coupled to the outer terminals through the via-hole.

7 Claims, 8 Drawing Sheets

INTEGRATED CIRCUIT PACKAGE AND MANUFACTURING METHOD THEREOF

CLAIM OF PRIORITY

This application claims priority to an application entitled "Integrated Circuit Package And Manufacturing Method Thereof" filed in the Korean Intellectual Property Office on Aug. 31, 2007 and assigned Serial No. 2007-88202, the contents of which are hereby incorporated by reference.

BACKGROUND OF THE INVENTION

1. Field of the Invention

The present invention relates to an integrated circuit package and a manufacturing method thereof and particularly to a fan-out structure of a wafer level package and a method of manufacturing the same.

2. Description of the Related Art

According to a recent trend of improving to achieve lightweight and compact parts, a wafer level package (WLP) technology is being introduced as a way of achieving this in the package assembly field. Being different from the conventional process in that every single chip separated from a wafer is packaged on one-by-one basis, the wafer level packaging makes it possible to finish the assembly process on the wafer without separating the chip. Briefly, there are four steps in this technology which are: circuit designing, wafer treating, assembling, and inspecting for the completion of the semiconductor manufacturing process. Among these steps, the assembling, which includes wire bonding and packaging, is performed by dicing the chip from the processed wafer; attaching the respective chip to a small substrate; bonding wire; and packaging the chip with plastic material. However, in the wafer level packaging, the packaging process is simply performed by initially applying photo-sensitive insulating materials to each of chips on the wafer instead of the conventional plastic material for packaging. Thereafter, the packaging process is finished by bonding the wire and applying the insulating material.

With the application of the above packaging technology, the semiconductor assembly process including the steps such as the wire bonding and the plastic material packaging may be eliminated. Furthermore, a significant reduction of cost can be attained because the plastic material, a circuit board and the bonding wire and etc. are not necessary. Particularly, the size of the package can be reduced by 20% in comparison to a conventional chip scale package (CSP) which has been employed in miniaturization efforts of the semiconductor. This is because it is possible to manufacture the package at the same size as the chip. Additionally, the existing wafer assembling facility and process can be employed in the manufacturing facility and process of the wafer level package.

On the other hand, as a part of multi-function and small-sized package technology in the next generation, attention has been recently paid to the development of a printed circuit board with a built-in IC (electronic device). In addition to the advantages such as the multi-function and small-sized package, the printed circuit board with the built-in IC provides more functions. It is not only because the wiring distance can be minimized in a high frequency above 100 MHz, but because there is a solution for improving the reliability problem which are associated with the connection of the parts using bonding wire or solder ball, which is adopted in a flexible circuit board or a ball grid array.

FIG. 1 is a cross-sectional view of an integrated circuit package according to a conventional technology.

FIG. 1 is a wafer level package using multi-layered PCB. As shown, an IC chip 10, which includes on its upper face a plurality of input/output pads 11 for electrical connection, is disposed within a cavity in an insulating layer 20 corresponding to a core insulating layer of the multi-layered PCB. The multi-layered PCB includes a plurality of the insulating layers 20 to 28 and a plurality of conductive patterns, which are stacked in alternate and repetitive manner. A via-hole is formed through the insulating layers 20 to 28. The electrical connection is made through the via-hole. In FIG. 1, the plurality of the input/output pads 11 is connected to outer terminals through solder-ball lands 31a, 31b, 32a, 32b, 33a, and 33b, the via-hole, and connection leads 31, 32, and 33. For the sake of convenience in illustration, the via-holes formed in each of the insulating layers 22 and 23 are omitted in the drawings.

FIG. 2 is a perspective top view illustrating the fan-out structure of the wafer level package shown in FIG. 1. FIGS. 3A, 3B and 3C are top views illustrating the fan-out structure in each of layers shown in FIG. 1.

Referring to FIGS. 2, 3A, 3B and 3C, the fanned-out type solder-ball lands 31a and 31b, 32a and 32b, and 33a and 33b are arranged in double rows on each of the insulating layers, thus three insulating layers are needed for the fan-out structure.

The sizes of the solder-hall and the bump are limited by the size of the via-hole formed in the PCB because the conventional wafer level package is electrically connected to the PCB through the via-hole. In other words, as the sizes of the solder ball and the bump are enlarged, they impose the restriction on increasing the amount of the input/output pads. Further, as a larger number of layers is needed when mounting on the embedded-type PCB, the total thickness of the PCB is unfavorably increased.

SUMMARY OF THE INVENTION

Accordingly, the present invention has been made to solve the above-mentioned problems occurring in the prior art, and provides additional advantages, by providing an IC package and a method of manufacturing the same, in which a larger number of input/output pads is accommodated without increasing the thickness and size of IC package when compared to the conventional art.

In accordance with an aspect of the present invention, an Integrated Circuit (IC) package includes: a multi-layered PCB having a plurality of insulating layers and a plurality of conductive pattern layers stacked in an alternate and repetitive manner, and a plurality of via-holes formed through the plurality of the insulating layers for electrical connection between the layers; and an IC chip disposed in a core insulating layer of the plurality of the insulating layers to be embedded in the multi-layered PCB and including a plurality of input/output pads on their surface, wherein the input/output pads disposed at an outermost area of the IC chip among the plurality of the input/output pads are coupled to outer terminals by connection members without passing through the via-hole; and wherein the remaining input/output pads except for the input/output pads disposed at the outermost area of the IC chip are coupled to the outer terminals through the via-hole.

The size and the interval of the connection members can be controlled depending on the number of the input/output pads disposed on the IC chip; and the sizes of the input/output pads disposed at the outermost area are smaller than that of the remaining input/output pads.

The connection members include outermost solder-ball lands formed on each of the input/output pads disposed at the outermost area of the IC chip; the remaining input/output pads except for the input/output pads disposed at the outermost area of the IC chip are coupled to the outer terminals through solder-ball lands formed on bottom face of the via-hole; and the outermost solder-ball lands have a smaller size or narrower interval than that of the solder-ball lands formed on the bottom face of the via-hole depending on the number of the input/output pads.

In accordance with an aspect of the present invention, an IC package of the present invention includes: a multi-layered PCB having a plurality of insulating layers and a plurality of conductive pattern layers stacked in alternate and repetitive manner and a plurality of via-holes formed through the plurality of the insulating layers for electrical connection between the layers; an IC chip disposed within a core insulating layer of the plurality of the insulating layers to be embedded in the multi-layered PCB and including a plurality of input/output pads on their surface; and a plurality of solder-ball lands having a fan-out structure for connecting the input/output pads to outer terminals; wherein outermost solder-ball lands disposed at the outermost area of the IC chip among the solder-ball lands are coupled to the outer terminals without passing through the via-holes.

The size or the interval of the outermost solder-ball lands can be controlled depending on the number of the plurality of the input/output pads disposed on the surface of the IC chip; and the size or the interval of the outermost solder-ball lands is smaller or narrower than that of the other solder-ball lands disposed on the IC chip.

In accordance with an aspect of the present invention, a method of manufacturing a IC package includes: forming a conductive pattern layer on upper and lower surfaces of a core insulating layer; forming a cavity for receiving the IC chip in the core insulating layer having the conductive pattern layer formed; disposing the IC chip with a plurality of input/output pads formed on its upper face in the cavity and filling the empty space of the cavity with insulating material; forming connection members for coupling outermost input/output pads disposed in outermost area among the plurality of the input/output pads to the conductive pattern layer formed on an upper face of the core insulating layer; building-up an insulating layer on a bottom face of the conductive pattern layer below the core insulating layer and on an upper face of the conductive pattern layer above the core insulating layer; forming via-holes through the insulating layer to expose at least a portion of the input/output pads except for the outermost input/output pads among the plurality of the input/output pads; and forming conductive patterns through the via-holes and connecting the input/output pads under the via-holes to outer terminals.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE INVENTION

Hereinafter, exemplary embodiments of the present invention will be described with reference to the accompanying drawings. For the purposes of clarity and simplicity, a detailed description of known functions and configurations incorporated herein will be omitted as it may make the subject matter of the present invention unclear.

Figure 1:
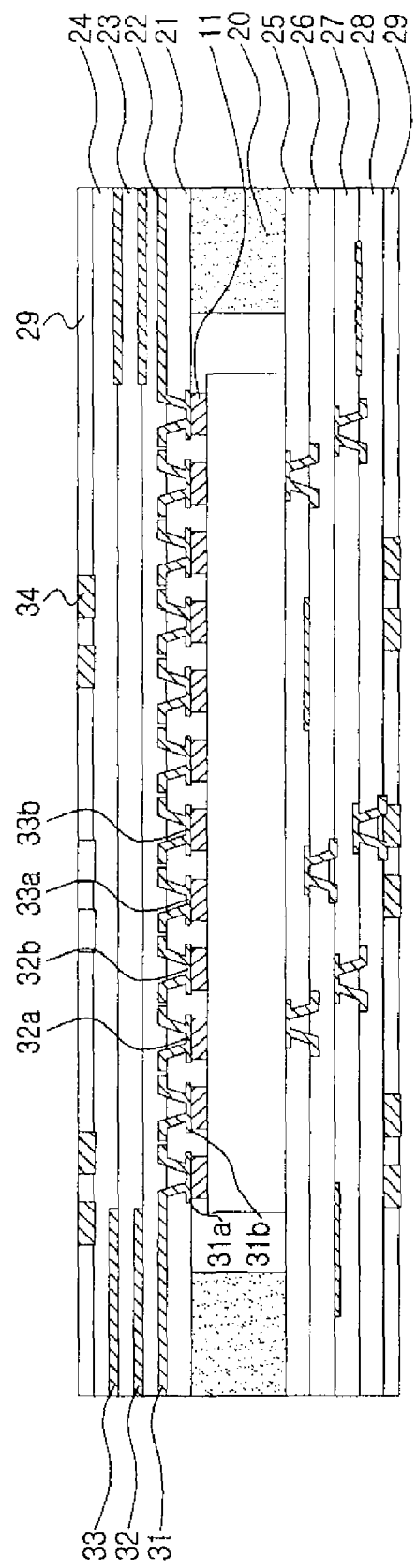
FIG. 1 is a cross-sectional view of an IC package according to a conventional technology.
Figure 2:
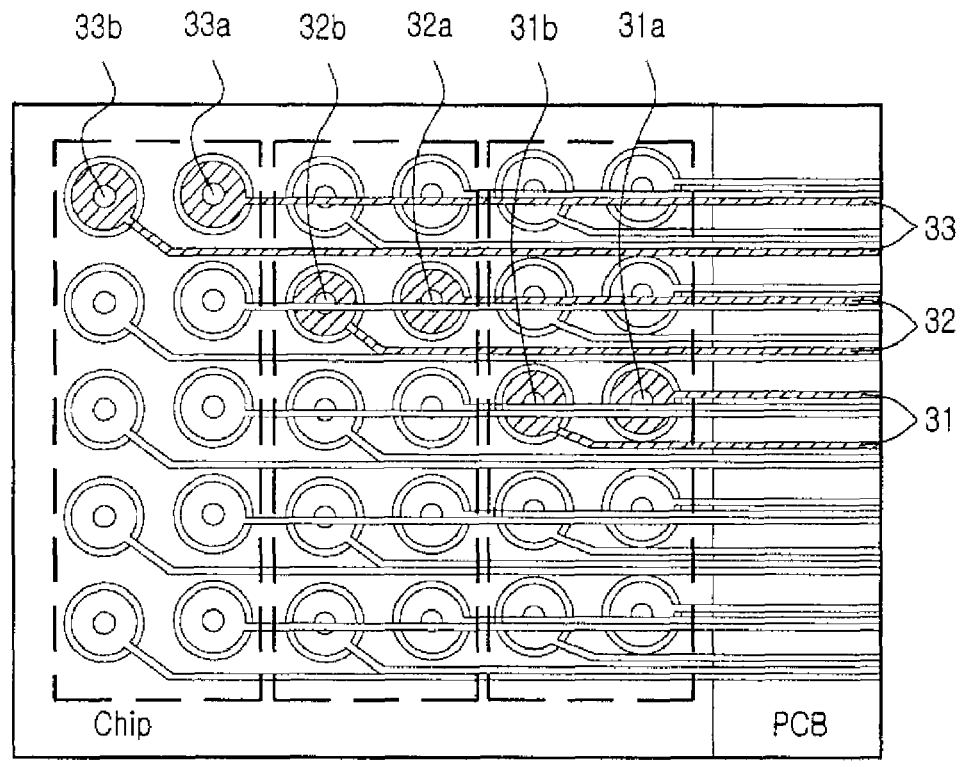
FIG. 2 is a perspective top view illustrating the fan-out structure of the wafer level package shown in FIG. 1.
Figure 3:
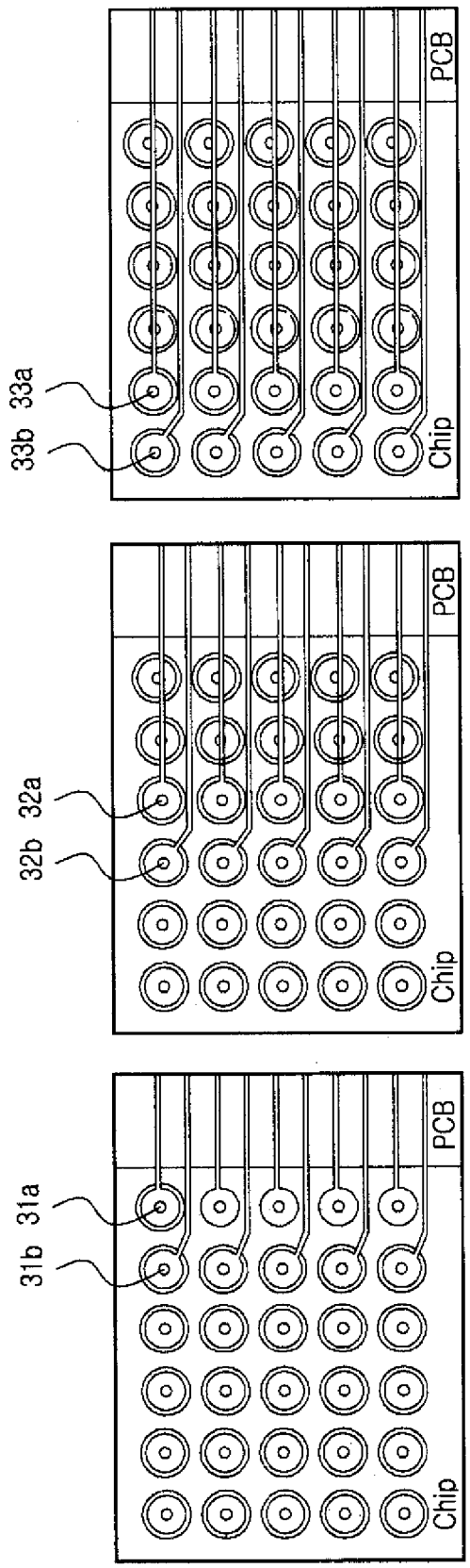
FIGS. 3A, 3B and 3C are top views illustrating the fan-out structure in each of layers shown in FIG. 1.
Figure 4:
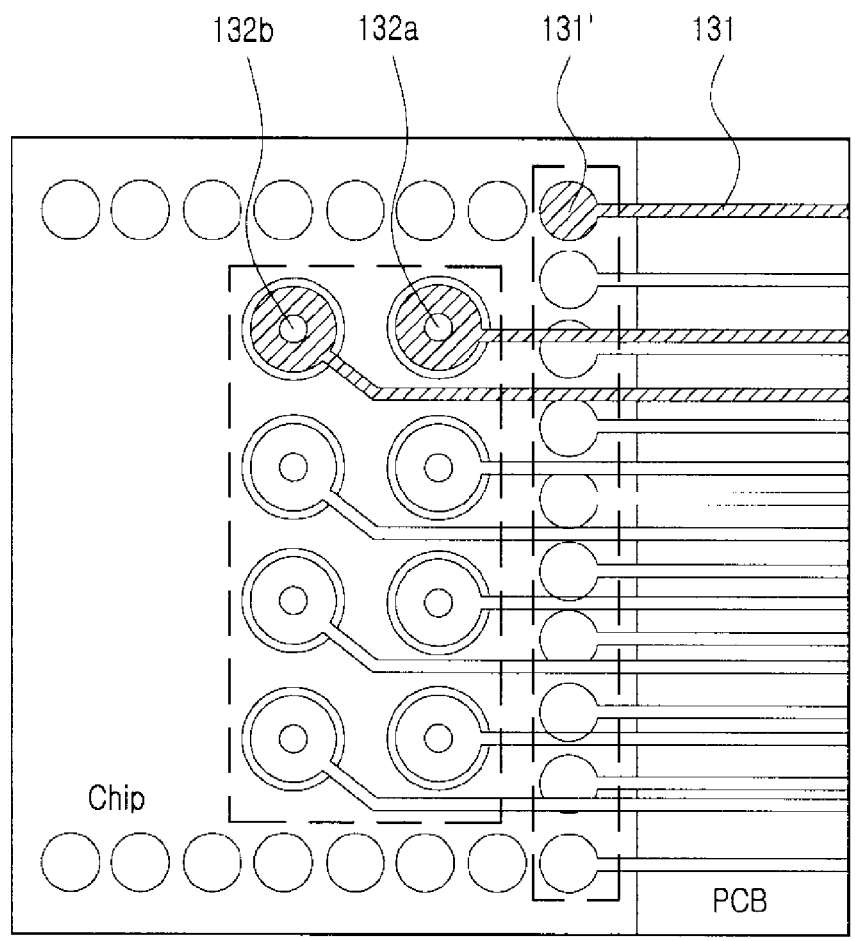
FIG. 4 is a perspective top view illustrating the fan-out structure in a wafer level package according to an embodiment of the present invention.

FIG. 4 is a perspective top view illustrating a part of the fan-out structure in a wafer level package according to an embodiment of the present invention.

Referring to FIG. 4, the fan-out structure of the present invention includes solder-ball lands on an IC chip, which are sequentially arranged in an array form from an outermost area. In comparison to the solder-ball lands 132a and 132b arranged at an inner area, the solder-ball lands 131' in the outermost area are smaller size and have narrower intervals there-between. During the arrangement of the solder-ball lands, the number of the solder-ball arrays can be reduced by initially arranging the solder-ball lands in the outermost area, then sequentially arranging the solder-ball lands from an innermost row adjacent to the outermost area. This means that the number of PCB layers needed for fan-out structure can be reduced. For instance, if the number of the input/output pads to be fanned-out equals to 192, it is possible to arrange 104 solder-ball lands 131' in the outermost area and arrange 84 solder-ball lands 132a and 132b in double rows at the inner area. The above-stated numerals are presented only for assisting the reader's understanding, thus these numerals may be adjusted depending on the number of the input/output pads and the size of the solder-ball lands arranged in the outermost area.

Figure 5:
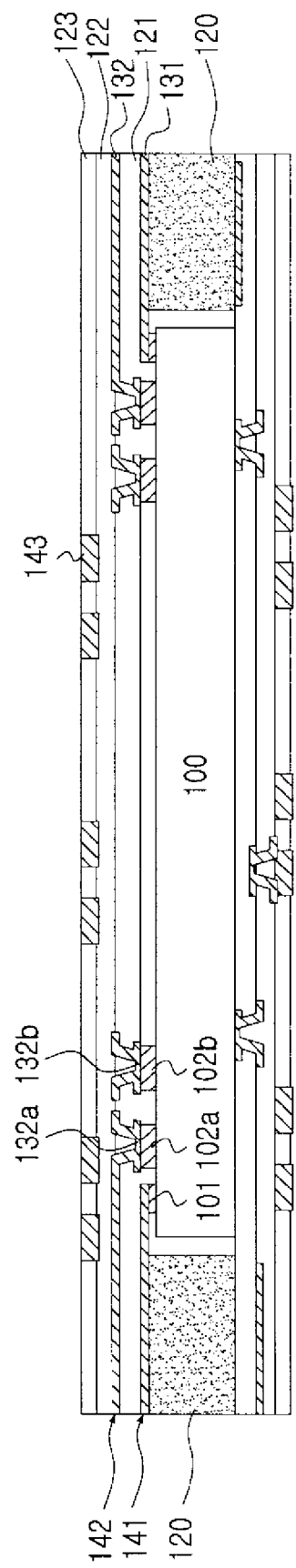
FIG. 5 is a cross-sectional view of the wafer level package in which the fan-out structure of FIG. 4 is embodied using the multi-layered PCB.
Figure 6B:
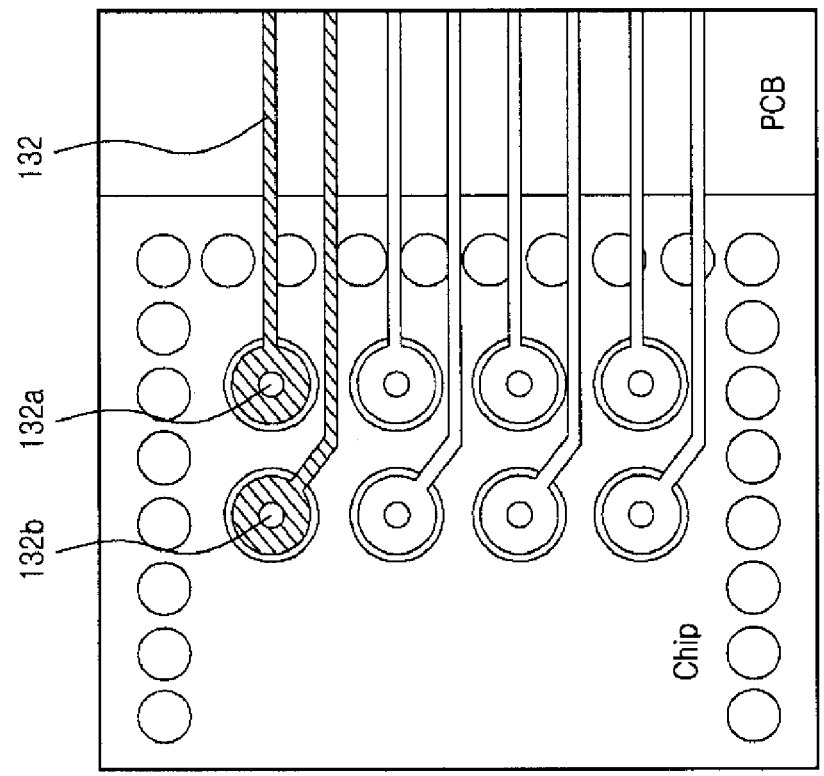
FIGS. 6A and 6B are top views of the fan-out structures in each of the layers shown in FIG. 5.
Figure 6A:
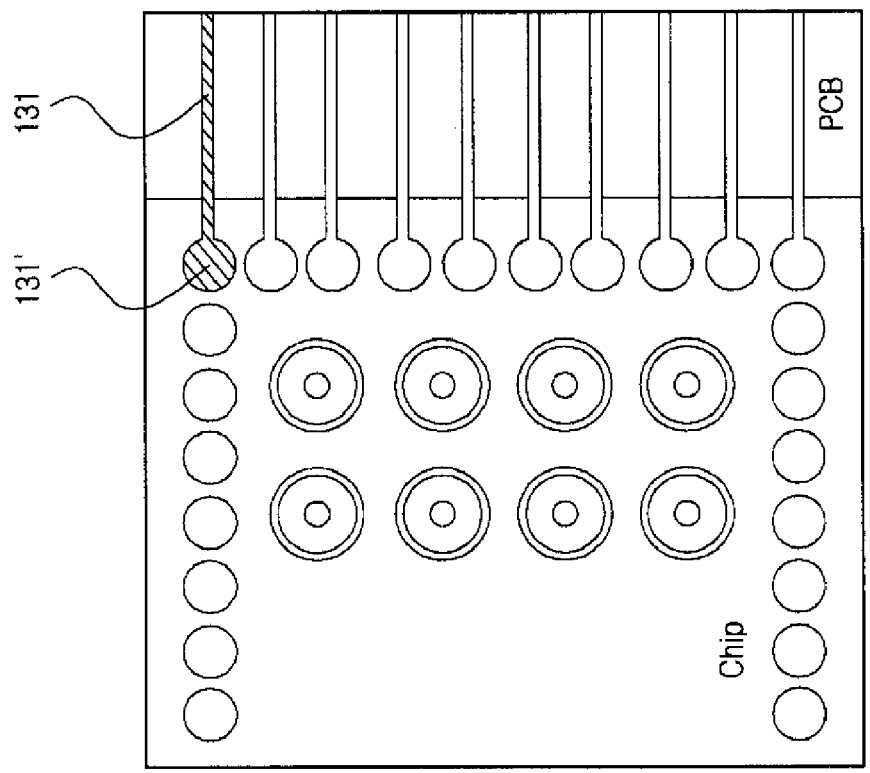

FIG. 5 is a cross-sectional view of the wafer level package, in which the fan-out structure shown in FIG. 4 is embodied using the multi-layered PCB. FIGS. 6A and 6B are top views of the fan-out structures in each of the layers shown in FIG. 5.

Referring to FIGS. 5, 6A and 6B, in the wafer level package according to the present invention, a chip 100, which has a plurality of input/output pads 101, 102a, and 102b disposed on its upper surface for outer electrical connection, is disposed in a cavity formed in an insulating layer 120 corresponding to a core insulating layer of the multi-layered PCB. The multi-layered PCB includes a plurality of insulating layers 121 to 123 and a plurality of conductive pattern layers 141~143 stacked in alternate and repetitive manner. The plurality of the insulating layers 121 and 122 is formed with via-holes, thus an electrical connection is made to the PCB through these via-holes. Here, the input/output pads 101 disposed in the outermost area of the IC chip 100 directly contacts the core insulating layer 120 for an outer electrical connection without passing through the via-holes. Accordingly, the input/output pads 101 can be formed to have a relatively small size in comparison to the input/output pads 102a and 102b disposed at inner area thereof. For instance, the input output pads 101 disposed in the outermost area are fanned out for the outer electrical connection through a solder-ball land 131' formed thereon and connection leads 131; and the input/output pads 102a and 102b disposed at the inner area are fanned out through the solder-ball lands 132a and 132b formed under the via-holes penetrating the insulating layers 121 and 122 and connection leads 132.

FIGS. 7A to 7F illustrate the manufacturing process for the wafer level package shown in FIG. 5.

Figure 7A:
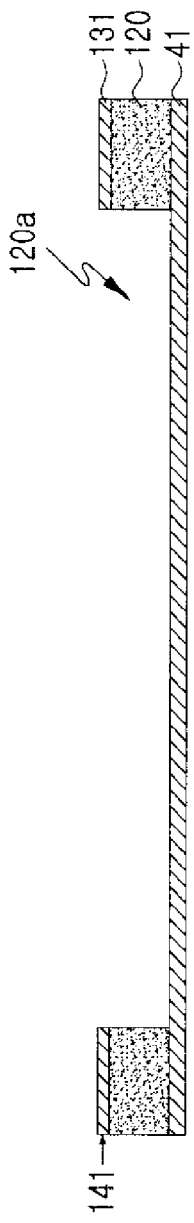
FIGS. 7A to 7F illustrate manufacturing processes for the wafer level package in accordance with an embodiment of the present invention.

Referring to FIG. 7A, a conductive pattern layer 41 and 141 is coated on upper and bottom faces of the core insulating layer 120, and the cavity 120a penetrating the coated core insulating layer 120 is formed to establish a space for receiving the IC chip. For instance, the core insulating layer 120 of FR4 material is prepared, and copper foils are coated on the upper and bottom faces of the core insulating layer 120. Thereafter, the copper foils are patterned by means of the conventional photolithography process to form a conductive pattern layer 141 including the connection lead 131. Note that the cavity 120a is formed using a conventional drilling process. The cavity has the same planar shape as the IC chip to be received therein, but it has a size larger shape than the IC chip.

Figure 7B:
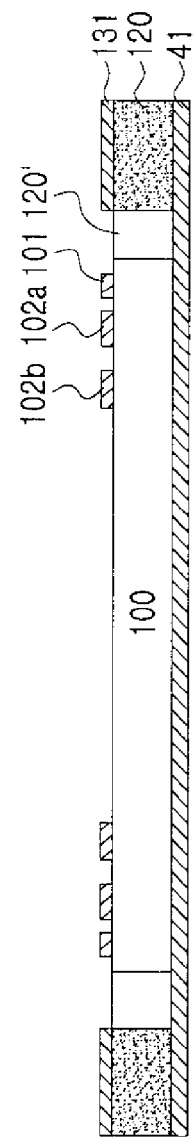

In FIG. 7B, the IC chip including the plurality of the input/output pads 101, 102a, and 102b on its upper face is disposed in the cavity 120a, then insulating material 120' is filled into the empty space of the cavity 120a.

Figure 7C:
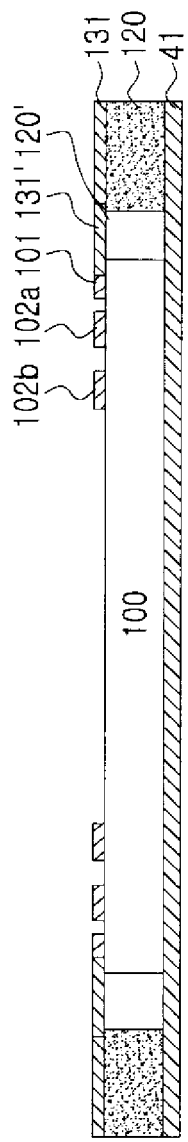

In FIG. 7C, the input/output pads 101 disposed in the outermost area among the plurality of the input/output pads 101, 102a, and 102b are connected to the connection lead 131. The copper foil is over-coated from the upper face of the input/output pad 101 disposed in the outermost area to the insulating material 120', then it is patterned by means of the conventional photolithography process to form a connection pattern 131'. Accordingly, the input/output pads disposed in the outermost area among the plurality of the input/output pads 101, 102a, and 102b are connected to the connection leads 131. Here, the input/output pads 101 disposed in the outermost area are connected to the connection leads 131 on the core insulating layer 120 by means of the connection pattern 131' without passing through the via-hole. In this case, the size of the connection pattern 131' is not limited by the size of the via-hole, and it can be reduced to the limit of the conductive pattern forming process that the PCB process allows.

Figure 7D:
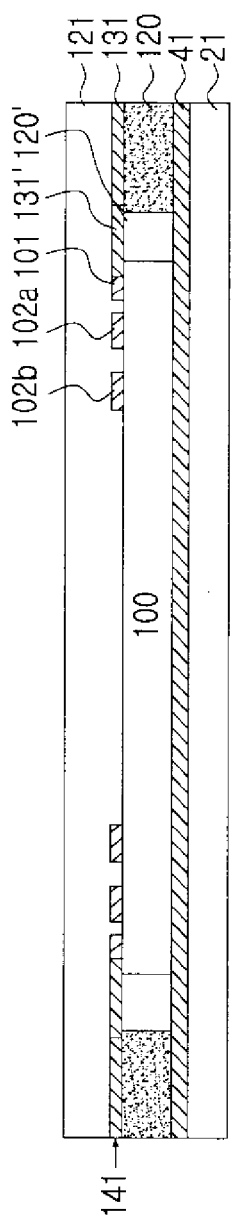

In FIG. 7D, the insulating layers 21 and 121 are built-up on the upper and the bottom faces of the conductive pattern layers 41 and 141. For instance, the insulation layers 21 and 121 may be of ABF (Ajnomoto Build-up Film).

Figure 7E:
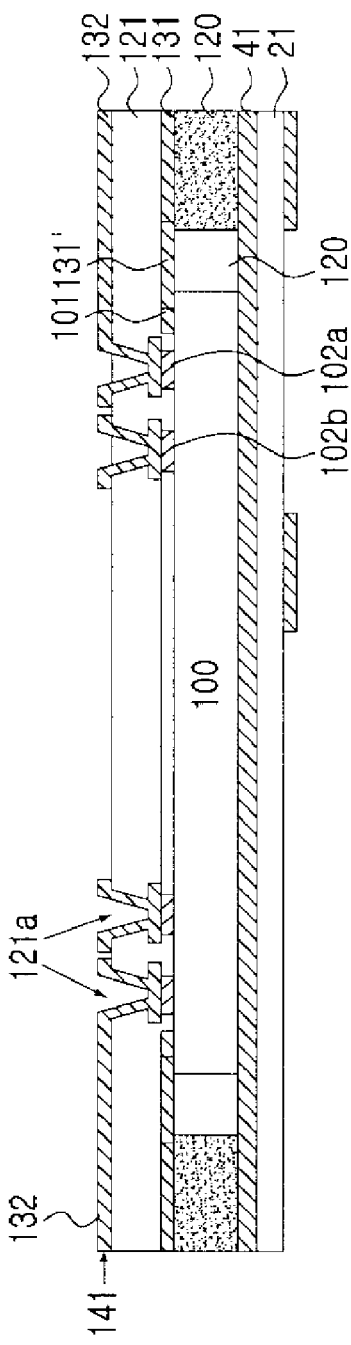

In FIG. 7E, the via-holes 121a are formed through the insulating layer 121 by means of the conventional drilling process, then the conductive pattern layer 142 including the solder-ball lands 132a and 132b and the connection leads 132 is formed over the input/output pads 102a and 102b. If needed, the conductive pattern layer 42 may be formed under the insulating layer 21.

Figure 7F:
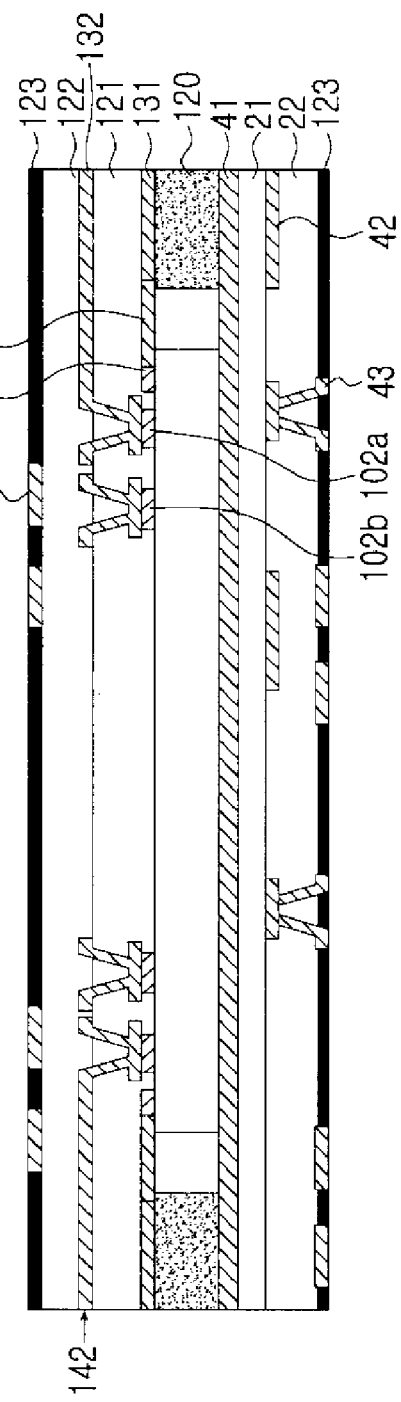

Thereafter, as illustrated in FIG. 7F, the insulating layers 22 and 122 and the conductive pattern layers 43 and 143 are formed above and below the conductive pattern layers 42 and 142, then a SR coating layer 123 is formed to prevent the surface from being scratched.

Having thus described an embodiment of integrated circuit packaging and its manufacturing method, it should be apparent to those skilled in the art that certain advantages of the system have been achieved. In the present invention, the input/output pads disposed in the outermost area are fanned out to be connected to the outer terminals without passing through the via-hole, thus a larger number of the input/output pads is received without increasing the size and the thickness of the PCB in comparison with the conventional structure. Accordingly, the IC package can be reduced in its size and thickness at the same time.

While the invention has been shown and described with reference to certain exemplary embodiments thereof it will be understood by those skilled in the art that various changes in form and details may be made therein without departing from the spirit and scope of the invention as defined by the appended claims.

What is claimed is:

1. An Integrated Circuit (IC) package comprising:
   a multi-layered PCB having a plurality of insulating layers and a plurality of conductive pattern layers stacked in an alternate and repetitive manner, and a plurality of via-holes formed through said plurality of the insulating layers for an electrical connection between the layers; and
   an IC chip disposed in a core insulating layer of said plurality of the insulating layers to be embedded in said multi-layered PCB and including a plurality of input/output pads thereof,
   wherein the input/output pads disposed at an outermost area of said IC chip among said plurality of the input/output pads are coupled to outer terminals by connection members without passing through said via-hole, and wherein the remaining input/output pads except for the input/output pads disposed at the outermost area of said IC chip are coupled to the outer terminals through said via-hole.

2. The IC package as claimed in claim 1, wherein the size and the interval of said connection members can be selectively adjusted depending on the number of the input/output pads disposed on said IC chip.

3. The IC package as claimed in claim 1, wherein the size of the input/output pads disposed at the outermost area is smaller than the remaining input/output pads.

4. The IC package as claimed in claim 2, wherein the size of the input/output pads disposed at the outermost area is smaller than the remaining input/output pads.

5. The IC package as claimed in claim 1, wherein:
   said connection members include outermost solder-ball lands formed on each of said input/output pads disposed at said outermost area of said IC chip;
   said remaining input/output pads except for said input/output pads disposed at said outermost area of said IC chip are coupled to the outer terminals through solder-ball lands formed on bottom face of said via-hole; and
   said outermost solder-ball lands have a smaller size or narrower interval than the size or the interval of said solder-ball lands formed on the bottom face of said via-hole, depending on the number of said input/output pads.

6. An IC package comprising:
   a multi-layered PCB having a plurality of insulating layers and a plurality of conductive pattern layers stacked in an alternate and repetitive manner and a plurality of via-holes formed through said plurality of the insulating layers for an electrical connection between the layers;
   an IC chip disposed within a core insulating layer of said plurality of the insulating layers to be embedded in said multi-layered PCB and including a plurality of input/output pads on their surface; and
   a plurality of solder-ball lands having a fan-out structure for making said input/output pads to be coupled to outer terminals, wherein outermost solder-ball lands disposed at the outermost area of said IC chip among said solder-ball lands are coupled to the outer terminals without passing through said via-holes.

7. The IC package as claimed in claim 6, wherein:

the size or the interval of said outermost solder-ball lands can be selectively adjusted depending on the number of said plurality of the input/output pads disposed on the surface of said IC chip; and the size or the interval of said outermost solder-ball lands is smaller or narrower than that the other solder-ball lands disposed on said IC chip.

\* \* \* \* \*